(12) United States Patent
Huang

(10) Patent No.: US 11,229,142 B2
(45) Date of Patent: Jan. 18, 2022

(54) FAN CONTROL SYSTEM

(71) Applicant: ASIA VITAL COMPONENTS CO., LTD., New Taipei (TW)

(72) Inventor: Po-Sheng Huang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 0 days.

(21) Appl. No.: 16/897,276

(22) Filed: Jun. 10, 2020

(65) Prior Publication Data

US 2021/0392778 A1 Dec. 16, 2021

(51) Int. Cl.
H05K 7/20 (2006.01)

(52) U.S. Cl.
CPC ..... H05K 7/20209 (2013.01); H05K 7/20136 (2013.01)

(58) Field of Classification Search
CPC .................. H05K 7/20209; H05K 7/20136
USPC .......................................................... 361/695
See application file for complete search history.

(56) References Cited

U.S. PATENT DOCUMENTS

| | | | |
|---|---|---|---|
| 1,944,024 A * | 1/1934 | Foster ..................... | G03B 19/18 352/92 |
| 6,340,874 B1 * | 1/2002 | Vladimir ............ | H05K 7/20209 318/461 |
| 6,814,546 B2 * | 11/2004 | Sekiguchi ............. | F04D 25/166 417/3 |
| 6,856,139 B2 * | 2/2005 | Rijken ............... | H05K 7/20209 165/80.2 |
| 7,196,903 B2 * | 3/2007 | Vuong .................... | G06F 1/206 318/471 |
| 7,355,359 B2 * | 4/2008 | Kuo .......................... | G06F 1/20 318/268 |
| 7,501,717 B2 * | 3/2009 | Chen ........................ | G06F 1/20 307/38 |
| 7,761,192 B2 * | 7/2010 | Lo ......................... | F04D 25/166 700/304 |
| 7,839,636 B2 * | 11/2010 | Hiroi ..................... | H05K 7/207 361/695 |
| 8,295,991 B2 * | 10/2012 | Chang .................... | G06F 1/206 700/300 |
| 8,896,253 B2 * | 11/2014 | Wu ....................... | F04D 27/004 318/500 |
| 9,223,325 B2 * | 12/2015 | Hensley .................. | G06F 1/206 |
| 2011/0176275 A1 * | 7/2011 | Sato .................... | H05K 7/20836 361/695 |
| 2018/0258942 A1 * | 9/2018 | Jeanneteau ............. | F24F 11/30 |
| 2019/0235592 A1 * | 8/2019 | Huang ................... | G06F 1/206 |

\* cited by examiner

*Primary Examiner* — Anatoly Vortman
(74) *Attorney, Agent, or Firm* — Demian K. Jackson; Jackson IPG PLLC

(57) ABSTRACT

A fan control system includes multiple fans and a control unit. The control unit has a controller and a storage device. The storage device stores therein a first fan activation data. According to the first fan activation data, the control unit sequentially controls multiple output pins to output multiple output signals. Each fan storage device stores therein a second fan activation data identical to the first fan activation data. According to the corresponding output signal, the fan controller compares with the second fan activation data to find out the second fan activation data matching the output signal, then the fan controller outputs a drive signal to control and activate the fan to operate.

12 Claims, 9 Drawing Sheets

17
178

| first fan input voltage value 12V | |
|---|---|
| activation input value (PWM duty ratio) | activation time point (second) |
| 0% | 0.4 |
| 25% | 0.7 |
| 50% | 1 |
| 75% | 1.3 |
| 100% | 1.6 |
| second fan input voltage value 12V | |
| activation input value (PWM duty ratio) | activation time point (second) |
| 0% | 0.6 |
| 25% | 0.9 |
| 50% | 1.2 |
| 75% | 1.5 |
| 100% | 1.8 |
| third fan input voltage value 12V | |
| activation input value (PWM duty ratio) | activation time point (second) |
| 0% | 0.8 |
| 25% | 1.1 |
| 50% | 1.4 |
| 75% | 1.7 |
| 100% | 2 |
| fourth fan input voltage value 12V | |
| activation input value (PWM duty ratio) | activation time point (second) |
| 0% | 1 |
| 25% | 1.3 |
| 50% | 1.6 |
| 75% | 1.9 |
| 100% | 2.2 |

Fig. 3A

| first fan input voltage value 12V | |
|---|---|
| activation input value (PWM duty ratio) | activation time point (second) |
| 0% | |
| 25% | |
| 50% | |
| 75% | |
| 100% | |

| second fan input voltage value 12V | |
|---|---|
| activation input value (PWM duty ratio) | activation time point (second) |
| 0% | 0.6 |
| 25% | 0.9 |
| 50% | 1.2 |
| 75% | 1.5 |
| 100% | 1.8 |

Fig. 3B

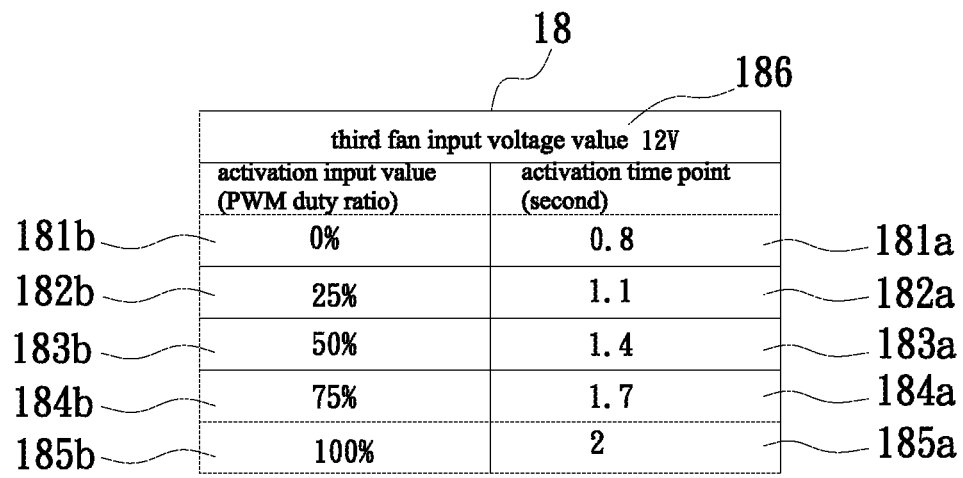
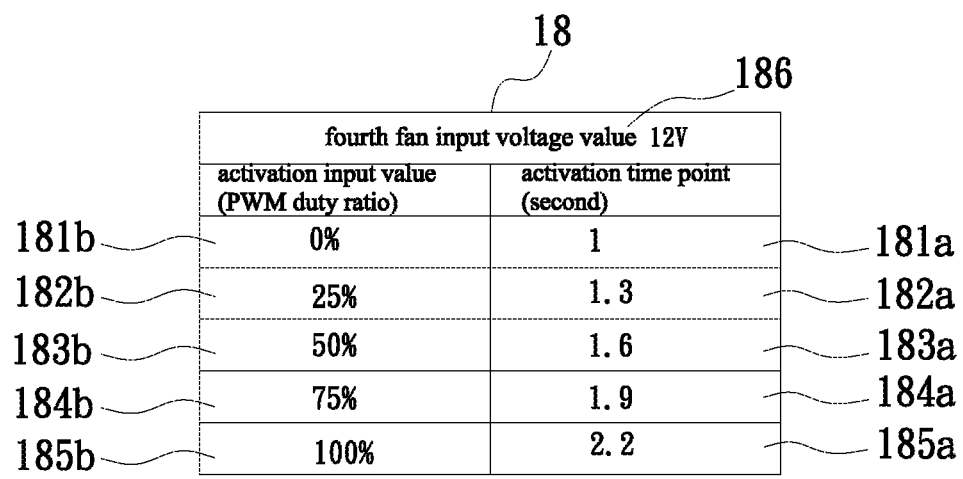
Fig. 3C

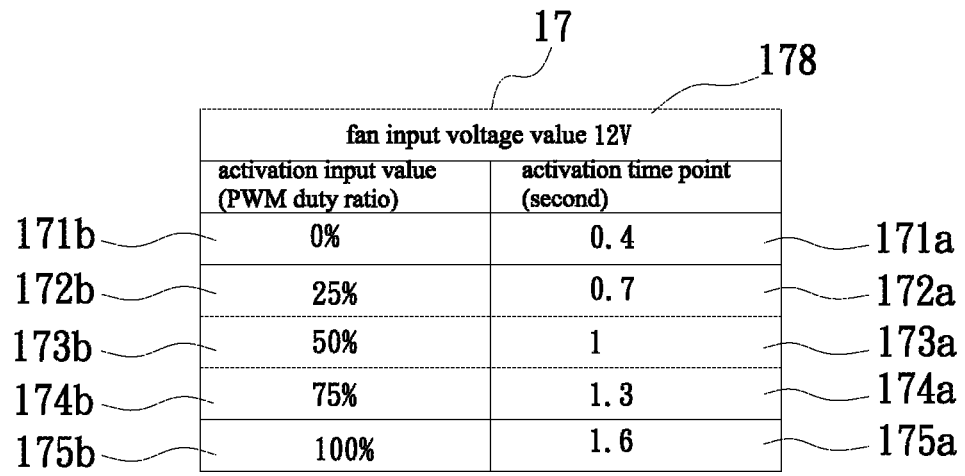
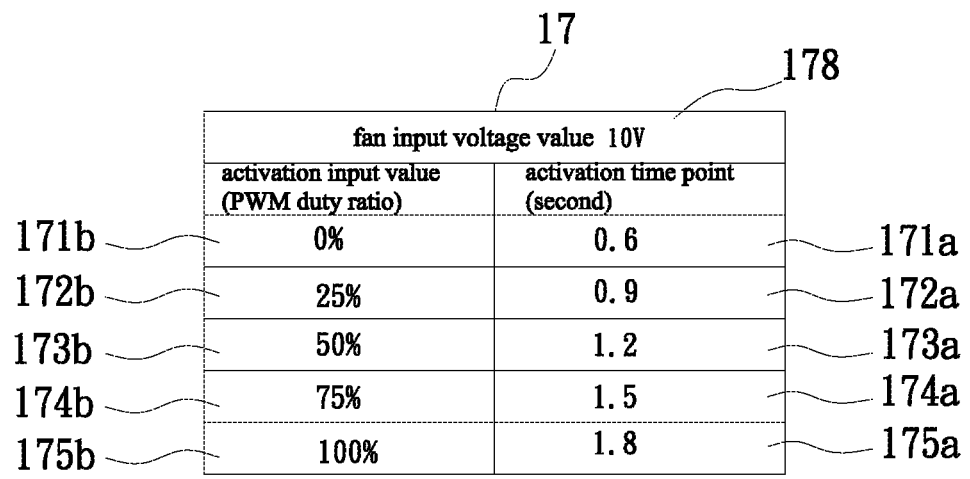
Fig. 5A

17 178

| fan input voltage value 12V ||
|---|---|
| activation input value (PWM duty ratio) | activation time point (second) |
| 0% | 0.4 |
| 25% | 0.7 |
| 50% | 1 |
| 75% | 1.3 |
| 100% | 1.6 |

17 178

| fan input voltage value 10V ||
|---|---|
| activation input value (volt) | activation time point (second) |
| 0 | 0.4 |
| 1 | 0.7 |
| 2 | 1 |
| 3 | 1.3 |
| 4 | 1.6 |
| 5 | 1.9 |

17 178

| fan input voltage value 12V ||
|---|---|
| activation input value (character string) | activation time point (second) |
| 00 | 0.4 |
| 01 | 0.7 |
| 10 | 1 |
| 11 | 1.3 |

Fig. 5B

| first, second, third and fourth fan input voltage values 12V ||
|---|---|
| activation input value (PWM duty ratio) | activation time point (second) |
| 0% | 0.4 |
| 25% | 0.7 |
| 50% | 1 |
| 75% | 1.3 |
| 100% | 1.6 |

17, 178, 171a–175a, 171b–175b

| first, second, third and fourth fan input voltage values 12V ||
|---|---|
| activation input value (PWM duty ratio) | activation time point (second) |
| 0% | 0.4 |
| 25% | 0.7 |
| 50% | 1 |
| 75% | 1.3 |
| 100% | 1.6 |

FAN CONTROL SYSTEM

BACKGROUND OF THE INVENTION

1. Field of the Invention

The present invention relates generally to a fan control system, and more particularly to a fan control system, which can lower instantaneous activation current.

2. Description of the Related Art

In general, according to application extent, computers can be mainly classified into personal computers, server workstations, and supercomputers. The personal computer generally employs one or two processors mainly in charge of daily administrational affair processing and providing relevant multimedia entertaining functions. With respect to some more complicated operations, for example, 3D computer drafting, work stations are widely used. In order to meet the requirements of the Internet, a server equipped with two to four processors is mostly employed in this field. In some special application situations, a server system with 8 to 16 processors can be alternatively used. With respect to the application field of some specific usages, such as nuclear bomb simulation, weather usage, genetic engineering, which necessitate super-high operation performances, a supercomputer composed of tens or even several hundreds or several thousands of serially connected processors (or sub-computer system) is often adopted.

With the advance of the semiconductor manufacturing process, currently, the chipset, such as central processing unit, has been developed from micrometer order to nanometer order. The number of the transistors contained in the chipset is up to one hundred millions. Therefore, in operation, the chipset will generate extremely high heat. In case the heat is not properly dissipated, the heat will accumulate in the case body to lead to an overly high environmental system temperature. As a result, the stability of the system will be deteriorated or even the system will malfunction or crash.

In the conventional technique, multiple cooling fans are installed in the case body to provide convection so as to dissipate the heat. This can effectively lower the temperature in the case body at a low manufacturing cost. Therefore, the cooling fans are widely used. However, such a conventional technique has a shortcoming in that the activation initial times of the multiple fans are set as fixed. Therefore, when powering on the server, all the hardware equipment disposed in the server start to operate at full speed. Accordingly, all the cooling fans installed in the server are activated to operate at the same time. As shown in FIG. 1, such a circumstance is apt to result in a situation that, when the multiple fans are activated, the peak value current (or so-called current peak value) of the corresponding current signals 301, 302, 303, 304 are added together in accordance with the number of the fans. In this case, the summed current signal 300 of the multiple fans is a summed peak value current vertically upwardly superimposed. However, the system will limit the activation current of the fans and provide an over-current protection system. Therefore, when the multiple fans are activated, the summed peak value current 300 of the instantaneously superimposed current signals is too high, (that is, when the multiple fans are activated at the same time, the sum of the corresponding currents is too high). This leads to greater consumption of the power by the server. As a result, the system is apt to operate unstably or even malfunction or crash. Also, the system may mis-trigger the over-current protection so that the multiple fans cannot successfully activate and operate. In this case, the system will overheat and shut down.

The applicant therefore provides a fan control system, which can lower the instantaneous activation current of the server when started so as to solve the problems existing in the conventional technique.

SUMMARY OF THE INVENTION

It is therefore a primary object of the present invention to provide a fan control system, which can lower instantaneous activation current.

It is a further object of the present invention to provide the above fan control system, which can achieve different lowered peak value currents.

To achieve the above and other objects, the fan control system of the present invention includes multiple fans and a control unit. The control unit has a controller and a storage device connected with the controller. The controller has multiple output pins. The storage device stores therein a first fan activation data. The first fan activation data includes multiple different first activation time points and multiple different first activation input values. Each first activation time point corresponds to each first activation input value. According to the multiple first activation time points, the controller sequentially controls the multiple output pins to output multiple output signals corresponding to the multiple first activation input values. The multiple output pins are connected with the multiple corresponding fans. Each fan is provided with a fan controller and a fan storage device connected with the fan controller. The fan storage device stores therein a second fan activation data identical to the first fan activation data. The second fan activation data includes multiple different second activation time points and multiple different second activation input values. Each second activation time point corresponds to each second activation input value. According to the corresponding output signals, the fan controller compares with the second fan activation data in the fan storage device to find out the second fan activation data matching the output signal, whereby at each second activation time point of the second fan activation data, the fan controller outputs a drive signal corresponding to each second activation input value to control and activate the fan to operate. By means of the design of the fan control system of the present invention, the instantaneously superimposed activation current of the multiple fans is effectively lowered so that the entire fan control system can stably operate.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein:

FIG. 3A is the first fan activation data table of a preferred embodiment of the present invention;

FIG. 3B is the second fan activation data tables of the first and second fans of a preferred embodiment of the present invention;

FIG. 3C is the second fan activation data tables of the third and fourth fans of a preferred embodiment of the present invention;

FIG. 5A is the fan activation data table of a modified embodiment of the present invention; and FIG. 5B is the fan activation data table of another modified embodiment of the present invention; and FIG. 6 is the fan activation data table of another modified embodiment of the present invention.

DETAILED DESCRIPTION OF THE PREFERRED EMBODIMENTS

Figure 1:
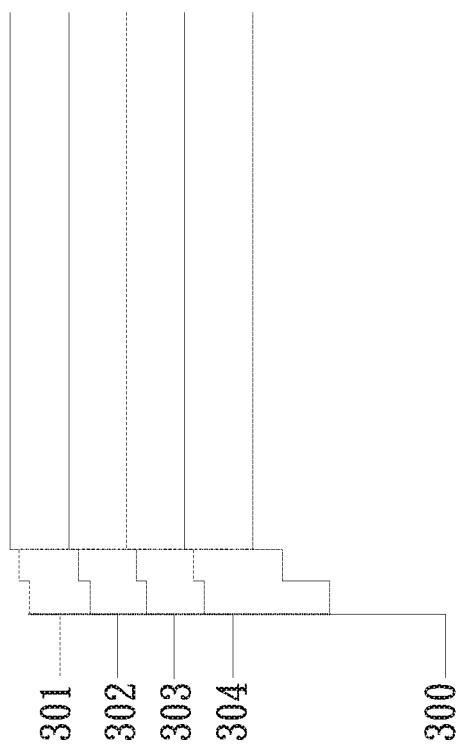
FIG. 1 is a schematic diagram showing the waveform of the activation peak value current of multiple conventional fans.
Figure 2:
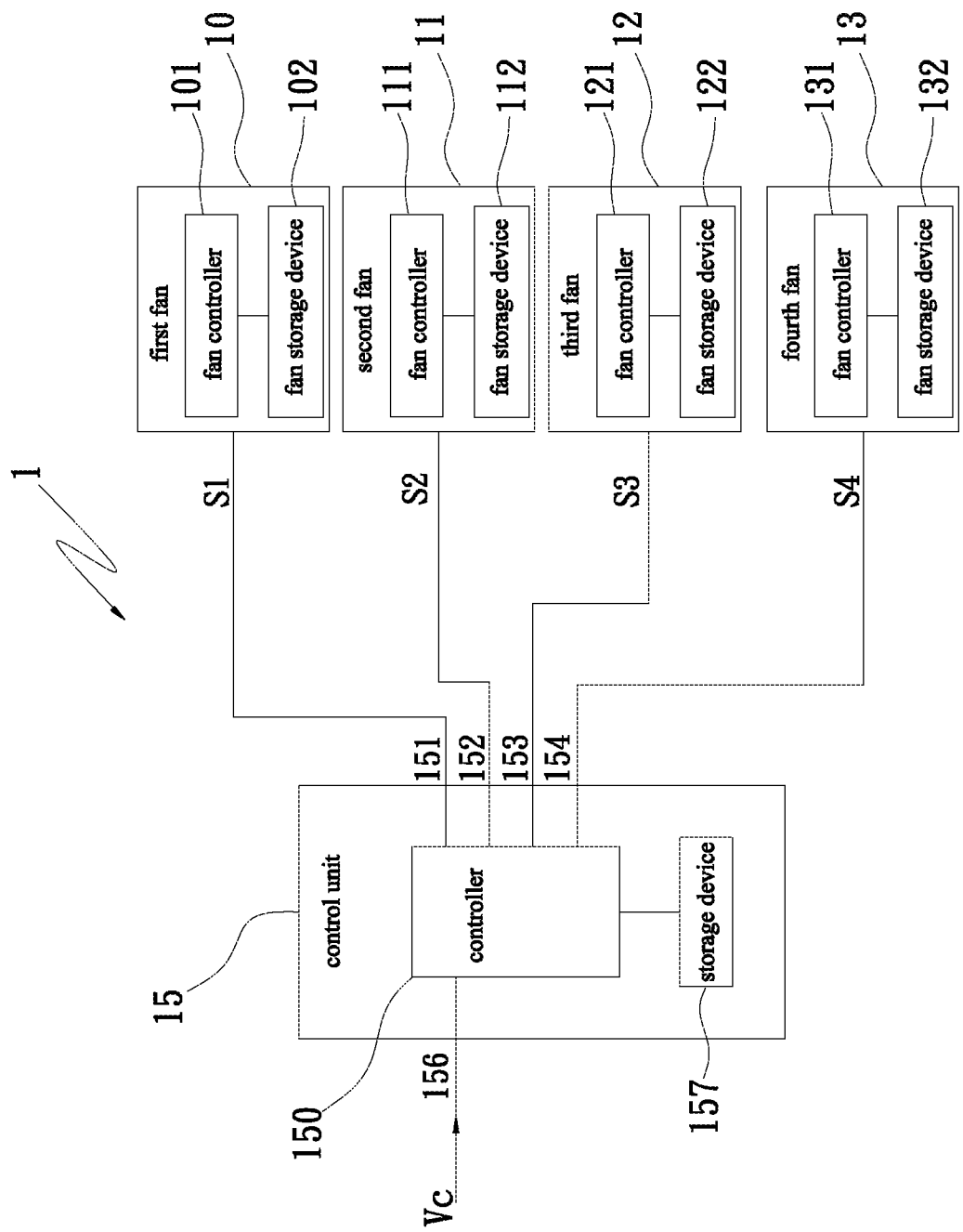
FIG. 2 is a block diagram of a preferred embodiment of the present invention.
Figure 4:
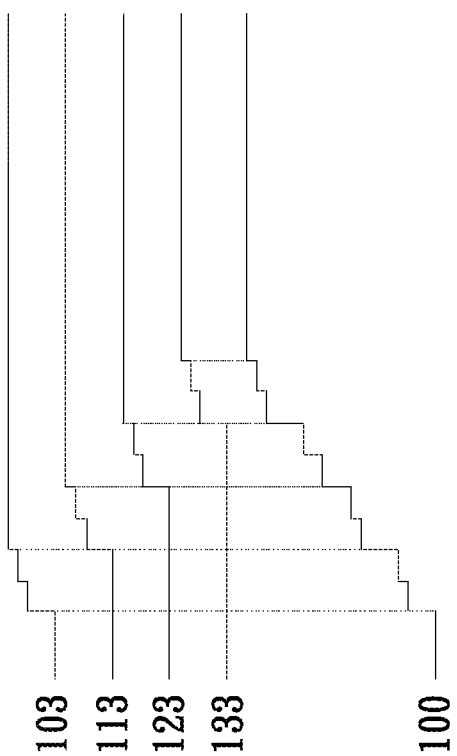
FIG. 4 is a schematic diagram showing the waveform of the power signals and summed power signal of multiple fans of a preferred embodiment of the present invention.

Please refer to FIGS. 2 to 5B. FIG. 2 is a block diagram of a preferred embodiment of the present invention. FIG. 3A is the first fan activation data table of a preferred embodiment of the present invention. FIG. 3B is the second fan activation data tables of the first and second fans of a preferred embodiment of the present invention. FIG. 3C is the second fan activation data tables of the third and fourth fans of a preferred embodiment of the present invention. FIG. 4 is a schematic diagram showing the waveform of the power signals and summed power signal of multiple fans of a preferred embodiment of the present invention. FIG. 5A is the fan activation data table of a modified embodiment of the present invention. FIG. 5B is the fan activation data table of another modified embodiment of the present invention. The fan control system 1 of the present invention is applied to an electronic apparatus (such as a computer, a server, a communication chassis or other electronic apparatus). The fan control system 1 includes multiple fans and a control unit 15. In this embodiment, the multiple fans are selectively a first fan 10, a second fan 11, a third fan 12 and a fourth fan 13 for illustration purposes. The control unit 15 has a controller 150 and a storage device 157. In this embodiment, the controller 150 is, but not limited to, a microcontroller unit (MCU). The controller 150 has multiple output pins and a power pin 156 for receiving an input voltage Vc (such as 12 volts or 10 volts). The output pins are respectively electrically connected with the corresponding fans.

The multiple output pins are a first output pin 151, a second output pin 152, a third output pin 153 and a fourth output pin 154. In this embodiment, the first, second, third and fourth output pins 151, 152, 153, 154 are pulse width modulation (PWM) output pins for outputting PWM signals, (that is, the output signals). That is, the first, second, third and fourth output pins 151, 152, 153, 154 serve to sequentially output a first output signal S1, a second output signal S2, a third output signal S3 and a fourth output signal S4, which are transmitted to the corresponding first, second, third and fourth fans 10, 11, 12, 13. The first, second, third and fourth output pins 151, 152, 153, 154 are correspondingly electrically connected with the first, second, third and fourth fans 10, 11, 12, 13. In practice, in addition to the first, second, third and fourth output pins 151, 152, 153, 154, the controller 150 further includes other pins for executing other controls.

In a preferred embodiment, the controller 150 can be a processor or a digital signal processor. The output pins are voltage output pins or string data output pins or other specific pins (such as I/O pins) for outputting the output signals (such as voltage signals or string data signals) to control and activate the corresponding fans.

Moreover, in the present invention, the number of the multiple output pins and the number of the fans are not limited to four. According to the heat dissipation requirement of the system, a user can previously design and selectively adjustably employ a controller 150 with more than two output pins in cooperation with more than two fans. For example, the controller 150 can have five output pins (such as five PWM output pins) electrically connected with five corresponding fans. The five output pins serve to output and transmit the five output signals to the five corresponding fans.

The storage device 157 can be a random access memory, a flash RAM, a hard disk drive (HDD), a solid state disk (SSD) or a USB flash drive or any other data access unit. The storage device 157 is electrically connected with the controller 150. The storage device 157 stores therein a first fan activation data 17. In this embodiment, the first fan activation data 17 are such as the fan activation data table (as shown in FIG. 3A). The first fan activation data 17 include multiple different first activation time points, multiple different first activation input values and an input voltage value 178. The input voltage value 178 is the input voltage value 178 (such as 12 volts or 10 volts) in the first fan activation data 17 corresponding to each fan, (that is, the first, second, third and fourth fans 10, 11, 12, 13). The multiple first activation time points are five first activation time points, (that is, first, second, third, fourth and fifth first activation time points 171a, 172a, 173a, 174a, 175a) corresponding to each fan. The five first activation time points are different from each other. The multiple first activation input values are five first activation input values, (that is, first, second, third, fourth and fifth first activation input values 171b, 172b, 173b, 174b, 175b) corresponding to each fan. The five first activation input values are different from each other. In addition, the five first activation time points correspond to the five first activation input values. In this embodiment, there are four sets of five first activation time points and five first activation input values in the first fan activation data 17 corresponding to the four fans 10, 11, 12, 13 for illustration purposes.

The five first activation time points of each set are later than each other by a certain time. For example, the fifth first activation time point 175a of each set is later than the fourth first activation time point 174a. The fourth first activation time point 174a is later than the third first activation time point 173a. The third first activation time point 173a is later than the second first activation time point 172a. The second first activation time point 172a is later than the first first activation time point 171a. In addition, the first set of five first activation time points are later than the corresponding second, third and fourth sets of first activation time points. For example, as shown in FIG. 3A, the first first activation time point 171a of the first set corresponding to the first fan 10 is earlier than the first first activation time point 171a of the second set (or the third set or fourth set) corresponding to the second fan 11 (or the third fan 12 or the fourth fan 13). The second second activation time point 172a of the first set corresponding to the first fan 10 is earlier than the second second activation time point 172a of the second set (or the third set or fourth set) corresponding to the second fan 11 (or the third fan 12 or the fourth fan 13), and so on as shown in FIG. 3A. In addition, the fifth first activation input value 175b of each set is larger than the fourth first activation input value 174b. The fourth first activation input value 174b is larger than the third first activation input value 173b. The third first activation input value 173*b* is larger than the second first activation input value 172*b*. The second first activation input value 172*b* of each set is larger than the first first activation input value 171*b*.

In addition, according to the multiple first activation time points, the controller 150 sequentially controls the multiple output pins to output the multiple output signals corresponding to the multiple first activation input values. That is, according to the input voltage Vc, the controller 150 compares with the first fan activation data 17 in the storage device 157 to find out the input voltage value 178 (such as 12 volts) matching the input voltage Vc (such as 12 volts). Therefore, according to the five first activation time points compared and found out from the first fan activation data 17 corresponding to the first, second, third and fourth fans 10, 11, 12, 13, the controller 150 sequentially controls the first, second, third and fourth output pins 151, 152, 153, 154 to output and transmit the first, second, third and fourth output signals S1, S2, S3, S4 corresponding to the five first activation input values of the first, second, third and fourth fans 10, 11, 12, 13 to the corresponding first, second, third and fourth fans 10, 11, 12, 13.

Please refer to FIG. 5A. In a preferred embodiment, the storage device 157 stores therein multiple first fan activation data 17. In each of the first fan activation data 17, the input voltage values 178 (such as 12 volts or 10 volts) are different. For example, the input voltage values 178 in the first first fan activation data 17 is such as 12 volts corresponding to the fan of 12 volts. The input voltage values 178 in the second second fan activation data 17 is such as 10 volts corresponding to the fan of 10 volts. As shown in FIG. 5B, in a modified embodiment, the storage device 157 stores therein multiple first fan activation data 17. In each of the first fan activation data 17, the data (including the input voltage value, the first activation input values and the first activation time points) have different types, wherein the data type of a first fan activation data 17 is PWM with different duty ratio, (that is, different activation input value) corresponding to different activation time point to operate. The data type of a second fan activation data 17 is different voltage, (that is, different activation input value) corresponding to different activation time point to operate. The data type of a third fan activation data 17 is different character string data (such as different digital character string, that is, different activation input value) corresponding to different activation time point to operate.

Please refer to FIGS. 2, 3A, 3B and 3C. Each fan, (that is, the first, second, third and fourth fans 10, 11, 12, 13) is provided with a fan controller 101, 111, 121, 131 and a fan storage device 102, 112, 122, 132 connected with the fan controller 101, 111, 121, 131. The fan storage device 102, 112, 122, 132 stores therein a second fan activation data 18 identical to the first fan activation data 17. The second fan activation data 18 include multiple different second activation time points, multiple different second activation input values and a fan voltage value 186 identical to the corresponding input voltage value. Each second activation time point corresponds to each second activation input value. The multiple second activation time points are five second activation time points 181*a*, 182*a*, 183*a*, 184*a*, 185*a* different from each other. The multiple second activation input values are five second activation input values 181*b*, 182*b*, 183*b*, 184*b*, 185*b* different from each other. In addition, the five second activation time points correspond to the five second activation input values. The first, second, third and fourth fans correspond to the five second activation time points 181*a*, 182*a*, 183*a*, 184*a*, 185*a* and the five second activation input values 181*b*, 182*b*, 183*b*, 184*b*, 185*b* in the fan storage devices 102, 112, 122, 132.

Moreover, the data (including the first activation input value, the first activation time point and the input voltage value) of each first fan activation data 17 in the controller 150 are in adaptation to and match the corresponding data (including the second activation input value, the second activation time point and the fan voltage value) of the second fan activation data 18 in each fan. In addition, in this embodiment, the five second activation time points, (that is, the first to the fifth second activation time points 181*a*, 182*a*, 183*a*, 184*a*, 185*a*) and the five second activation input values, (that is, the first to the fifth second activation input values 181*b*, 182*b*, 183*b*, 184*b*, 185*b*) of the first fan 10 (the second fan 11, the third fan 12 or the fourth fan 13) are identical to the five first activation time points 171*a*, 172*a*, 173*a*, 174*a*, 175*a* and the five first activation input values 171*b*, 172*b*, 173*b*, 174*b*, 175*b* of the corresponding first set (the second set, the third set or the fourth set) and thus will not be redundantly described hereinafter. Also, the fan voltage value 186 is the voltage value in the second fan activation data 18 corresponding to the fan. Moreover, in this embodiment, the voltage values of the first, second, third and fourth fans 10, 11, 12, 13 are identical to each other.

According to the corresponding output signal, the fan controllers 101, 111, 121, 131 compare with the second fan activation data 18 in the fan storage devices 102, 112, 122, 132 to find out the second fan activation data 18 matching the output signal. At each second activation time point of the second fan activation data 18, a drive signal corresponding to each second input value is output to control and activate the fan to operate. That is, according to the first output signal S1 (or the second output signal S2 or the third output signal S3 or the fourth output signal S4), the fan controller 101 (or 111 or 121 or 131) of the first fan 10 (or the second fan 11 or the third fan 12 or the fourth fan 13) compares with the second fan activation data 18 in the fan storage device 102 (or 112 or 122 or 132) to find out the second fan activation data 18 matching the first output signal S1 (or the second output signal S2 or the third output signal S3 or the fourth output signal S4). Accordingly, at each second activation time point of the second fan activation data 18, a first drive signal (or a second drive signal or a third drive signal or a fourth drive signal) corresponding to each second input value is output by the fan controller 101 (or 111 or 121 or 131) of the first fan 10 (or the second fan 11 or the third fan 12 or the fourth fan 13) to control and activate the first fan 10 (or the second fan 11 or the third fan 12 or the fourth fan 13) to operate and obtain the power signals (such as the first, second, third and fourth current signals 103, 113, 123, 133) respectively corresponding to the first, second, third and fourth fans 10, 11, 12, 13 and the summed power signal 100 of all the fans as shown in FIG. 4. Also, the peak value currents (or so-called current peak values) of the first, second, third and fourth current signals 103, 113, 123, 133 are staggered. For example, according to the first output signal S1 such as a PWM signal with 25% duty ratio, the fan controller 101 of the first fan 10 compares with the second fan activation data 18 in the fan storage device 102 to find out the second activation input value 182*b* with such as 25% duty ratio of the second fan activation data 18 matching the first output signal S1. Accordingly, at the second activation time point 182*a* such as 0.7 second of the second fan activation data 18, the fan controller 101 of the first fan 10 outputs the first drive signal such as a PWM signal with 25% duty ratio corresponding to the second activation input value 182b with such as 25% duty ratio to control and activate the first fan 10 to operate, and so on with respect to the second, third and fourth fans 11, 12, 13. Therefore, in the present invention, the first, second, third and fourth fans 10, 11, 12, 13 are activated at different times, whereby the first, second, third and fourth fans 10, 11, 12, 13 themselves can judge the activation time to operate. Accordingly, the peak values of the first, second, third and fourth drive signals S1, S2, S3, S4 are staggered so as to achieve the effect that the first, second, third and fourth fans 10, 11, 12, 13 are activated at different times and the instantaneous activation current is lowered.

In addition, by means of the fan control system 1 of the present invention, a user can preset the data of the first and second fan activation data 17, 18, such as the first and second activation input values, the first and second activation time points, the input voltage value 178 and the fan voltage value 186) so as to set up different output signals, (that is, the first, second, third and fourth output signals S1, S2, S3, S4) and different drive signals to define the initial activation time points of the multiple fans, (that is, the first, second, third and fourth fans 10, 11, 12, 13) after powered. Accordingly, the multiple fans themselves can judge and activate (or operate) according to the corresponding time difference. Therefore, when activated, the summed power signal 100 of all the fans is a summed peak value current in the form of an elongated stair obliquely extending from lower side to upper side (as shown in FIG. 4). Accordingly, the first, second, third and fourth fans 10, 11, 12, 13 are activated at different times and the superimposed peak value current of the multiple activated fans can be effectively lowered. In addition, the entire fan control system 1 can effectively stably operate to avoid mis-triggering of the over-current protection of the fan control system 1.

An embodiment of the present invention is taken as an example for illustration as follows:

When the fan control system 1 is powered on, the controller 150 receives the input voltage Vc such as 12 volts and compares with the first fan activation data 17 in the storage device 157 to find out the input voltage value 178 such as 12 volts matching the input voltage Vc. Thereafter, the controller 150 reads the five first activation time points 171a, 172a, 173a, 174a, 175a and the five first activation input values 171b, 172b, 173b, 174b, 175b corresponding to the first, second, third and fourth fans 10, 11, 12, 13 in the first fan activation data 17 corresponding to the input voltage value 178. At the same time, according to the four sets of the five first activation time points 171a, 172a, 173a, 174a, 175a, the controller 150 sequentially at the first, second, third and fourth sets of the five first activation time points 171a, 172a, 173a, 174a, 175a controls the first, second, third and fourth output pins 151, 152, 153, 154 to output the first, second, third and fourth output signals S1, S2, S3, S4 corresponding to the four sets of the five first activation input values 171b, 172b, 173b, 174b, 175b. The first fan 10 first receives the first output signal S1 such as a PWM signal with 25% duty ratio. The fan controller 101 of the first fan 10 compares with the second fan activation data 18 in the fan storage device 102 to find out the second activation input value 182b with such as 25% duty ratio of the second fan activation data 18 matching the first output signal S1. At this time, at the second activation time point 182a such as 0.7 second, the fan controller 101 of the first fan 10 outputs the first drive signal (such as a PWM signal with 25% duty ratio) corresponding to the second activation input value 182b with such as 25% duty ratio to control and activate the first fan 10 to operate. Then, at the second activation time point 182a later than the first fan 10 by such as 0.2 second, (that is, waiting for 0.9 second), the fan controller 111 of the second fan 11 outputs the second drive signal (such as a PWM signal with 25% duty ratio) to control and activate the second fan 11 to operate. Then, at the second second activation time point 181a later than the second fan 10 by such as 0.2 second, (that is, waiting for 1.1 second), the fan controller 121 of the third fan 12 outputs the third drive signal (such as a PWM signal with 25% duty ratio) to control and activate the third fan 11 to operate. Finally, at the second activation time point 181a later than the third fan 12 by such as 0.2 second, (that is, waiting for 1.3 second), the fan controller 131 of the fourth fan 13 outputs the fourth drive signal (such as a PWM signal with 25% duty ratio) to control and activate the fourth fan 13 to operate. At the other four second activation time points 181a, 183a, 184a, 185a of the first, second, third and fourth fans 10, 11, 12, 13, the first, second, third and fourth drive signals corresponding to the other four second activation input values 181b, 183b, 184b, 185b are output to control and activate the fan to operate in a similar manner.

As shown in FIGS. 2 and 6. In a modified embodiment, the five first activation time points and the five first activation input values 1 in the single first fan activation data 17 in the controller 150 correspond to multiple fans (such as the first, second, third and fourth fans 10, 11, 12, 13). In addition, the second activation data 18 in the multiple fans are identical to the first fan activation data 17 in the controller 150. A user can preset the sequence in which the multiple output pins output the multiple output signals and preset the activation input values corresponding to each output pin when the controller 150 is initially powered on. For example, when the fan control system 1 is powered on, the controller 150 controls the first, second, third and fourth output pins 151, 152, 153, 154 to sequentially output the first, second, third and fourth output signals S1, S2, S3, S4 at an interval (such as one second) corresponding to the first preset activation input value as 0% duty ratio, the second preset activation input value 172b as 25% duty ratio, the third preset activation input value as 50% duty ratio and the four preset activation input value as 75% duty ratio and sequentially transmit the first, second, third and fourth output signals S1, S2, S3, S4 to the corresponding first, second, third and fourth fans 10, 11, 12, 13. The first fan 10 first receives the corresponding first output signal S1 such as a PWM signal with 25% duty ratio. The fan controller 101 compares with the second fan activation data 18 to find out the first second activation input value 181b with such as 0% duty ratio of the second fan activation data 18 matching the first output signal S1. At this time, the fan controller 101 outputs the first drive signal (such as a PWM signal with 0% duty ratio) corresponding to the first output signal S1 to control and activate the first fan 11 to initially operate (activated to be operated). Then, the fan controller 111 of the second fan 11 outputs the second drive signal (such as a PWM signal with 25% duty ratio) corresponding to the second second activation input value 182b as 25% duty ratio to control and activate the second fan 11 to initially operate. Then, the fan controller 121 of the third fan 12 outputs the third drive signal (such as a PWM signal with 50% duty ratio) corresponding to the third second activation input value 183b as 50% duty ratio to control and activate the third fan 12 to initially operate. Finally, the fan controller 131 of the fourth fan 13 outputs the fourth drive signal (such as a PWM signal with 75% duty ratio) corresponding to the fourth second activation input value 184b as 75% duty ratio to control and activate the fourth fan 13 to initially operate. At this time, after all the multiple fans have been initially operated, according to the first fan activation data 17 in cooperation with the second fan activation data 18 of the multiple fans, the controller 150 controls to the multiple fans to sequentially operate.

Therefore, by means of the design of the fan control system 1 of the present invention, the activation time points of all the fans are delayed and staggered, whereby the fan control system 1 can effectively lower the instantaneously superimposed activation current of the multiple fans. Also, the system is prevented from being turned on/off when not completely initially powered on. In addition, the fan control system 1 can effectively avoid mis-triggering of the overcurrent protection so that the fan control system 1 can stably operate.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A fan control system comprising:
a control unit having a controller and a storage device connected with the controller, the controller having multiple output pins, the storage device storing therein a first fan activation data, the first fan activation data including multiple different first activation time points and multiple different first activation input values, each first activation time point corresponding to each first activation input value, according to the multiple first activation time points, the controller sequentially controlling the multiple output pins to output multiple output signals corresponding to the multiple first activation input values; and
multiple fans connected with the multiple corresponding output pins, each fan being provided with a fan controller and a fan storage device connected with the fan controller, the fan storage device storing therein a second fan activation data identical to the first fan activation data, the second fan activation data including multiple different second activation time points and multiple different second activation input values, each second activation time point corresponding to each second activation input value, according to the corresponding output signals, the fan controller comparing with the second fan activation data in the fan storage device to find out the second fan activation data matching the output signal, whereby at each second activation time point of the second fan activation data, the fan controller outputs a drive signal corresponding to each second activation input value to control and activate the fan to operate.

2. The fan control system as claimed in claim 1, wherein the multiple first activation time points are five first activation time points corresponding to each fan, the five first activation time points being different from each other, the multiple first activation input values being five first activation input values corresponding to each fan, the five first activation input values being different from each other, the five first activation time points corresponding to the five first activation input values.

3. The fan control system as claimed in claim 2, wherein the multiple second activation time points are five second activation time points, the five second activation time points being different from each other, the multiple second activation input values being five second activation input values, the five second activation input values being different from each other, the five second activation time points corresponding to the five second activation input values.

4. The fan control system as claimed in claim 3, wherein the multiple fan are a first fan, a second fan, a third fan and a fourth fan, the first, second, third and fourth fans corresponding to the five second activation time points and the five second activation input values of the fan storage devices, the multiple output pins being a first output pin, a second output pin, a third output pin and a fourth output pin, the first, second, third and fourth output pins being electrically connected with the corresponding first, second, third and fourth fans, the first, second, third and fourth output pins serving to sequentially output a first output signal, a second output signal, a third output signal and a fourth output signal, which are transmitted to the corresponding first, second, third and fourth fans.

5. The fan control system as claimed in claim 4, wherein according to the five first activation time points corresponding to the first, second, third and fourth fans, the controller sequentially controls the first, second, third and fourth output pins to output the first, second, third and fourth output signals corresponding to the five first activation input values of the first, second, third and fourth fans to the first, second, third and fourth fans.

6. The fan control system as claimed in claim 4, wherein according to the first output signal, the fan controller of the first fan compares with the second fan activation data in the fan storage device to find out the second fan activation data matching the first output signal, whereby at each second activation time point of the second fan activation data, the fan controller of the first fan outputs a first drive signal corresponding to each second activation input value to control and activate the first fan to operate, according to the second output signal, the fan controller of the second fan comparing with the second fan activation data in the fan storage device to find out the second fan activation data matching the second output signal, whereby at each second activation time point of the second fan activation data, the fan controller of the second fan outputs a second drive signal corresponding to each second activation input value to control and activate the second fan to operate.

7. The fan control system as claimed in claim 4, wherein according to the third output signal, the fan controller of the third fan compares with the second fan activation data in the fan storage device to find out the second fan activation data matching the third output signal, whereby at each second activation time point of the second fan activation data, the fan controller of the third fan outputs a third drive signal corresponding to each second activation input value to control and activate the third fan to operate, according to the fourth output signal, the fan controller of the fourth fan comparing with the second fan activation data in the fan storage device to find out the second fan activation data matching the fourth output signal, whereby at each second activation time point of the second fan activation data, the fan controller of the fourth fan outputs a fourth drive signal corresponding to each second activation input value to control and activate the fourth fan to operate.

8. The fan control system as claimed in claim 4, wherein according to an input voltage, the controller compares with the first fan activation data in the storage device to find out an input voltage value matching the input voltage, whereby according to the five first activation time points compared and found out from the first fan activation data corresponding to the first, second, third and fourth fans, the controller sequentially controls the first, second, third and fourth output pins to output and transmit the first, second, third and fourth output signals corresponding to the five first activation input values of the first, second, third and fourth fans to the corresponding first, second, third and fourth fans.

9. The fan control system as claimed in claim 1, wherein the multiple output pins are pulse width modulation (PWM) output pins, voltage output pins or string data output pins.

10. The fan control system as claimed in claim 1, wherein the multiple output signals are pulse width modulation (PWM) signals, voltage signals or string data signals.

11. The fan control system as claimed in claim 1, wherein the controller is a microcontroller unit, a processor or a digital signal processor.

12. The fan control system as claimed in claim 1, wherein the storage device is a random access memory, a flash RAM, a hard disk drive (HDD), a solid state disk (SSD) or a USB flash drive.

\* \* \* \* \*